(12) United States Patent
Das et al.

(10) Patent No.: US 7,705,362 B2
(45) Date of Patent: Apr. 27, 2010

(54) SILICON CARBIDE DEVICES WITH HYBRID WELL REGIONS

(75) Inventors: Mrinal Kanti Das, Durham, NC (US); Sei-Hyung Ryu, Cary, NC (US)

(73) Assignee: Cree, Inc., Durham, NC (US)

( * ) Notice: Subject to any disclaimer, the term of this patent is extended or adjusted under 35 U.S.C. 154(b) by 313 days.

(21) Appl. No.: 11/513,473

(22) Filed: Aug. 31, 2006

(65) Prior Publication Data
US 2006/0289874 A1 Dec. 28, 2006

Related U.S. Application Data

(62) Division of application No. 10/873,394, filed on Jun. 22, 2004, now Pat. No. 7,118,970.

(51) Int. Cl.
*H01L 31/0312* (2006.01)

(52) U.S. Cl. .......... 257/77; 257/E29.104; 257/E21.054

(58) Field of Classification Search .................. 257/77, 257/E21.054, E29.104
See application file for complete search history.

(56) References Cited

U.S. PATENT DOCUMENTS

| | | | |
|---|---|---|---|
| 3,629,011 A | 12/1971 | Tohi et al. ............. 148/1.5 |
| 4,466,172 A | 8/1984 | Batra ................. 29/571 |
| 4,811,065 A | 3/1989 | Cogan ................ 257/328 |
| 5,111,253 A | 5/1992 | Korman et al. .......... 257/341 |
| 5,170,231 A | 12/1992 | Fujii et al. ............ 257/77 |
| 5,184,199 A | 2/1993 | Fujii et al. ............. 29/10 |
| 5,270,554 A | 12/1993 | Palmour .............. 257/77 |
| 5,348,895 A | 9/1994 | Smayling et al. ......... 437/54 |
| 5,384,270 A | 1/1995 | Ueno |
| 5,385,855 A | 1/1995 | Brown et al. ........... 437/41 |
| 5,393,999 A | 2/1995 | Malhi ................ 257/289 |
| 5,396,085 A | 3/1995 | Baliga ................ 257/77 |
| 5,506,421 A | 4/1996 | Palmour .............. 257/77 |

(Continued)

FOREIGN PATENT DOCUMENTS

DE 19832329 A1 2/1998

(Continued)

OTHER PUBLICATIONS

First Office Action, Chinese Application No. 200580020597.5, Jun. 27, 2008.

(Continued)

*Primary Examiner*—Jarrett J Stark
(74) *Attorney, Agent, or Firm*—Myers Bigel Sibley & Sajovec (57) ABSTRACT

MOS channel devices and methods of fabricating such devices having a hybrid channel are provided. Exemplary devices include vertical power MOSFETs that include a hybrid well region of silicon carbide and methods of fabricating such devices are provided. The hybrid well region may include an implanted p-type silicon carbide well portion in a p-type silicon carbide epitaxial layer, an implanted p-type silicon carbide contact portion that contacts the implanted p-type silicon carbide well portion and extends to a surface of the p-type epitaxial layer and/or an epitaxial p-type silicon carbide portion, at least a portion of the epitaxial p-type silicon carbide well portion corresponding to a p-type channel region of the MOSFET.

27 Claims, 7 Drawing Sheets

U.S. PATENT DOCUMENTS

| | | | |
|---|---|---|---|
| 5,510,281 A | 4/1996 | Ghezzo et al. | 437/41 |
| 5,510,630 A | 4/1996 | Agarwal | 257/77 |
| 5,629,531 A | 5/1997 | Palmour | 257/77 |
| 5,710,059 A | 1/1998 | Rottner | 437/151 |
| 5,726,463 A | 3/1998 | Brown et al. | 257/77 |
| 5,734,180 A | 3/1998 | Malhi | 257/77 |
| 5,763,905 A | 6/1998 | Harris | 257/77 |
| 5,804,483 A | 9/1998 | Harris | 438/268 |
| 5,814,859 A | 9/1998 | Ghezzo et al. | 257/335 |
| 5,837,572 A | 11/1998 | Gardner et al. | 438/199 |
| 5,851,908 A | 12/1998 | Harris et al. | 438/520 |
| 5,877,041 A | 3/1999 | Fuller | 438/105 |
| 5,917,203 A | 6/1999 | Bhatnagar et al. | 257/139 |
| 5,972,801 A | 10/1999 | Lipkin et al. | 438/770 |
| 5,976,936 A | 11/1999 | Miyajima et al. | 438/268 |
| 6,020,600 A | 2/2000 | Miyajima et al. | 257/76 |
| 6,025,233 A | 2/2000 | Teresawa | 438/270 |
| 6,025,608 A | 2/2000 | Harris et al. | 257/77 |
| 6,054,352 A * | 4/2000 | Ueno | 438/268 |
| 6,096,607 A | 8/2000 | Ueno | 438/522 |
| 6,100,169 A | 8/2000 | Suvorov et al. | 438/519 |
| 6,107,142 A | 8/2000 | Suvorov et al. | |
| 6,117,735 A | 9/2000 | Ueno | 438/268 |
| 6,133,587 A | 10/2000 | Takeuchi et al. | 257/77 |
| 6,165,822 A | 12/2000 | Okuno et al. | 438/142 |
| 6,180,958 B1 | 1/2001 | Cooper, Jr. | 257/77 |
| 6,204,135 B1 | 3/2001 | Peters et al. | 438/301 |
| 6,221,700 B1 | 4/2001 | Okuno et al. | 438/151 |
| 6,228,720 B1 | 5/2001 | Kitabatake et al. | 438/268 |
| 6,238,967 B1 | 5/2001 | Shiho et al. | 438/244 |
| 6,239,463 B1 | 5/2001 | Williams et al. | 257/328 |
| 6,246,076 B1 | 6/2001 | Lipkin et al. | 257/77 |
| 6,297,100 B1 | 10/2001 | Kumar et al. | 438/268 |
| 6,303,508 B1 | 10/2001 | Alok | 438/705 |
| 6,316,791 B1 | 11/2001 | Schorner et al. | 257/77 |
| 6,344,663 B1 | 2/2002 | Slater, Jr. et al. | 257/77 |
| 6,399,996 B1 | 6/2002 | Chang et al. | 257/484 |
| 6,420,225 B1 | 7/2002 | Chang et al. | 438/237 |
| 6,429,041 B1 * | 8/2002 | Ryu et al. | 438/105 |
| 6,448,160 B1 | 9/2002 | Chang et al. | 438/527 |
| 6,452,228 B1 | 9/2002 | Okuno et al. | |
| 6,455,892 B1 | 9/2002 | Okuno | 257/77 |
| 6,482,704 B1 * | 11/2002 | Amano et al. | 438/285 |
| 6,551,865 B2 | 4/2003 | Kumar et al. | 438/137 |
| 6,573,534 B1 | 6/2003 | Kumar et al. | 257/77 |
| 6,593,620 B1 | 7/2003 | Hshieh et al. | 257/335 |
| 6,610,366 B2 | 8/2003 | Lipkin | 427/378 |
| 6,653,659 B2 | 11/2003 | Ryu et al. | 257/77 |
| 6,759,684 B2 | 7/2004 | Fukuda et al. | 257/77 |
| 6,767,843 B2 | 7/2004 | Lipkin et al. | 438/758 |
| 6,841,812 B2 | 1/2005 | Zhao | |
| 6,940,110 B2 | 9/2005 | Takahashi et al. | |
| 6,979,863 B2 | 12/2005 | Ryu | |
| 2002/0038891 A1* | 4/2002 | Ryu et al. | 257/350 |
| 2002/0047125 A1 | 4/2002 | Fukuda et al. | 257/77 |
| 2002/0102358 A1 | 8/2002 | Das et al. | 472/377 |
| 2002/0149022 A1 | 10/2002 | Ryu et al. | |
| 2003/0089930 A1 | 5/2003 | Zhao | |
| 2004/0119076 A1 | 6/2004 | Ryu | 257/77 |
| 2004/0211980 A1 | 10/2004 | Ryu | 257/200 |
| 2004/0212011 A1 | 10/2004 | Ryu | 257/335 |

FOREIGN PATENT DOCUMENTS

| | | |
|---|---|---|
| DE | 19809554 | 9/1998 |
| DE | 19900171 | 12/2000 |
| DE | 10036208 | 2/2002 |
| EP | 0 637 069 B1 | 2/1995 |
| EP | 1 058 317 A2 | 12/2000 |
| EP | 1 204 145 A2 | 8/2002 |
| JP | 01117363 | 5/1989 |
| JP | 03034466 | 2/1991 |
| JP | 03157974 | 7/1991 |
| JP | 08264766 | 10/1996 |
| JP | 09205202 | 8/1997 |
| JP | 10-308510 | 11/1998 |
| JP | 10308501 | 11/1998 |
| JP | 11191559 | 7/1999 |
| JP | 11238742 | 8/1999 |
| JP | 11261061 | 9/1999 |
| JP | 11266017 | 9/1999 |
| JP | 11274487 | 10/1999 |
| JP | 2000049167 | 2/2000 |
| JP | 2000-082812 | 3/2000 |
| JP | 2000082812 | 3/2000 |
| JP | 2000106371 | 4/2001 |
| WO | WO 97/98754 | 3/1997 |
| WO | WO 97/39485 | 10/1997 |
| WO | WO 98/02916 | 1/1998 |
| WO | WO 98/02924 | 1/1998 |
| WO | WO 00/13236 | 3/2000 |

OTHER PUBLICATIONS

International Search Report and the Written Opinion of the International Searching Authority corresponding to PCT/US2005/011130, mailed Nov. 28, 2005.

Palmour et al. "SiC Device Technology: Remaining Issues," Diamond and Related Materials. vol. 6, 1997, pp. 1400-1404.

Rao et al. "P-N Junction Formation in 6H-SiC by Acceptor Implantation into N-Type Substrate," Nuclear Instruments and Methods in Physics Research B. vol. 106, 1995, pp. 333-338.

Rao et al. "Al and N Ion Implantations in 6H-SiC," Silicon Carbide and Related Materials. 1995 Conf, Kyoto, Japan. Published 1996.

Capano, M.A., et al., Ionization Energies and Electron Mobilities in Phosphorus—and Nitrogen-Implanted 4H-Silicon Carbide, IEEE ICSCRM Conference 1999, Research Triangle Park, North Carolina (Oct. 10-13, 1999).

Patel, R., et al., Phosphorus-Implanted High-Voltage N.sup,+P 4H-SiC Junction Rectifiers, Proceedings of 1998 International Symposium on Poer Semiconductor Devices & ICs, pp. 387-390 (Kyoto).

Dastidar, Sujoyita, A Study of P-Type Activation in Silicon Carbide, Thesis (Purdue University, May 1998).

A.K. Agarwal, J.B. Casady, L.B. Rowland, W.F. Valek, and C.D. Brandt, "1400 V 4H-SiC Power MOSFET's," *Materials Science Forum* vols. 264-268, pp. 989-992, 1998.

A.K. Agarwal, J.B. Casady, L.B. Rowland, W.F. Valek, M.H. White, and C.D. Brandt, "1.1 kV 4H-SiC Power UMOSFET's," *IEEE Electron Device Letters*, vol. 18, No. 12, pp. 586-588, Dec. 1997.

A.K. Agarwal, N.S. Saks, S.S. Mani, V.S. Hegde and P.A. Sanger, "Investigation of Lateral RESURF, 6H-SiC MOSFETs," *Materials Science Forum*, vols. 338-342, pp. 1307-1310, 2000.

A.K. Agarwal, S. Seshadri, and L.B. Rowland, "Temperature Dependence of Fowler-Nordheim Current in 6H-and 4H-SiC MOS Capacitors," *IEEE Electron Device Letters*, vol. 18, No. 12, Dec. 1997, pp. 592-594.

A.V. Suvorov, L.A. Lipkin, G.M. Johnson, R. Singh and J.W. Palmour, "4H-SiC Self-Aligned Implant-Diffused Structure for Power DMOSFETs," *Materials Science Forum* vols. 338-342, pp. 1275-1278, 2000.

Agarwal et al. "A Critical Look at the Performance Advantages and Limitations of 4H-SiC Power UMOSFET Structures," *1996 IEEE ISPSD and IC's Proc.*, May 20-23, 1996, pp. 119-122.

Baliga, Power Semiconductor Devices, Chapter 7, PWS Publishing, 1996.

Bhatnagar et al. "Comparison of 6H-SiC, 3C-SiC, and Si for Power Devices," *IEEE Transactions on Electron Devices*, vol. 40, No. 3, Mar. 1993, pp. 645-655.

D. Alok, E. Arnold, and R. Egloff, "Process Dependence of Inversion Layer Mobility in 4H-SiC Devices," *Materials Science Forum*, vols. 338-342, pp. 1077-1080, 2000.

Das, Mrinal K. Graduate thesis entitled, *Fundamental Studies of the Silicon Carbide MOS Structure.* Purdue University, 1999.

Fukuda at al. "Improvement of $SiO_2$/4H-SiC Interface Using High-Temperature Hydrogen Annealing at Low Pressure and Vacuum Annealing," *Jpn J. Appl. Phys.* vol. 38, Apr. 1999, pp. 2306-2309.

G.Y. Chung, C.C. Tin, J.R. Williams, K. McDonald, M. Di Ventra, S.T. Pantelides, L.C, Feldman, and R.A. Weller, "Effect of nitric oxide annealing on the interface trap densities near the band edges in the 4H polytype of silicon carbide," *Applied Physics Letters*, vol. 76, No. 13, pp. 1713-1715, Mar. 2000.

G.Y. Chung, C.C. Tin, J.R. Williams, K. McDonald, R.K. Chanana, R.A. Weller, S.T. Pantelides, L.C. Feldman, O.W. Holland, M.K. Das, and J.W. Palmour, "Improved Inversion Channel Mobility for 4H-SiC MOSETs Following High Temperature Anneals in Nitric Oxide," *IEEE Electron Device Letters*, vol. 22, No. 4, Apr. 2001.

J. Tan, J.A. Cooper, Jr., and Mr. R. Melloch, "High-Voltage Accumulation-Layer UMOSFETs in 4H-SiC," *IEEE Electron Device Letters*, vol. 19, No. 12, pp. 487-489, Dec. 1998.

J.B. Casady, A.K. Agarwal, L.B. Rowland, W.F. Valek, and C.D. Brandt, "900 V DMOS and 1100 V UMOS 4H-SiC Power FETs," *IEEE Device Research Conference*, Ft. Collins, CO Jun. 23-25, 1997.

J.N. Shenoy, J.A. Cooper and M.R. Meelock, "High-Voltage Double-Implanted Power MOSFETs in 6H-SiC," *IEEE Electron Device Letters*, vol. 18, No. 3, pp. 93-95, Mar. 1997.

K. Ueno and Tadaaki Oikawa, "Counter-Doped MOSFET's of 4H-SiC," *IEEE Electron Device Letters*, vol. 20, No. 12, pp. 624-626, Dec. 1999.

K. Ueno, R. Asai, and T. Tsuji. "4H-SiC MOSFET's Utilizing the H2 Surface Cleaning Technique." *IEEE Electron Device Letters*, vol. 19, No. 7, Jul. 1998, pp. 244-246.

L.A. Lipkin and J.W. Palmour, "Low interface state density oxides on p-type SiC," Materials Science Forum vols. 264-268, pp. 853-856, 1998.

Lipkin et al. "Insulator Investigation on SiC for Improved Reliability," *IEEE Transactions on Electron Devices*. vol. 46, No. 3, Mar. 1999, pp. 525-532.

Lipkin et al. "Challenges and State-of-the-Art Oxides in SiC," *Mat. Res. Soc. Symp. Proc.* vol. 640, 2001, pp. 27-29.

M. K. Das, L.A. Lipkin, J.W. Palmour, G.Y. Chung, J.R. Williams, K. McDonald, and L.C. Feldman, "High Mobility 4H-SiC Inversion Mode MOSFETs Using Thermally Grown, NO Annealed $SiO_2$," *IEEE Device Research Conference*, Denver, CO Jun. 19-21, 2000.

M.K. Das, J.A. Cooper, Jr., M.R. Melloch, and M.A. Capano, "Inversion Channel Mobility in 4H- and 6H-SiC MOSFETs," *IEEE Semiconductor Interface Specialists Conference*, San Diego, CA, Dec. 3-5, 1998.

Mondal et al. "An Integrated 500-V Power DSMOSFET/Antiparallel Rectifier Device with Improved Diode Reverse Recovery Characteristics," *IEEE Electron Device Letters*, vol. 23, No. 9, Sep. 2002, pp. 562-564.

Motorola Power MOSFET Transistor Databook, 4th edition. Motorola, INc., 1989, pp. 2-5-4-2-5-7.

P.M. Shenoy and B.J. Baliga, "The Planar 6H-SiC ACCUFET: A New High-Voltage Power MOSFET Structure," *IEEE Electron Device Letters*, vol. 18, No. 12, pp, 589-591, Dec. 1997.

R. Schörner, P. Friedrichs, D. Peters, H. Mitlehner, B. Weis, and D. Stephani, "Rugged Power MOSFETs in 6H-SiC with Blocking Capability up to 1800 V," *Materials Science Forum* vols. 338-342, pp. 1295-1298, 2000.

R. Schorner, P. Friedrichs, D. Peters, and D. Stephani, "Significantly Improved Performance of MOSFETs on Silicon Carbide Using the 15R-SiC Polytype," *IEEE Electron Device Letters*, vol. 20, No. 5, pp. 241-244, May 1999.

Ranbir Singh, Sei-Hyung Ryu and John W. Palmour, "High Temperature, High Current, 4H-SiC Accu-DMOSFET," Materials Science Forum vols. 338-342, pp. 1271-1274, 2000.

Ryu et al. Article and Presentation: "27 m$\Omega$-cm$^2$, 1.6 kV Power DiMOSFETs in 4H-SiC," *Proceedings of the 14 International Symposium on Power Semiconductor Devices & ICs 2002*, Jun. 4-7, 2002, Santa Fe, NM.

S. Sridevan and B. Jayant Baliga, "Lateral N-Channel Inversion Mode 4H-SiC MOSFET's," *IEEE Electron Device Letters*, vol. 19, No. 7, pp. 228-230, Jul. 1998.

S.T. Pantelides, "Atomic Scale Engineering of SiC Dielectric Interfaces," DARPA/MTO High Power and ONR Power Switching MURI Reviews, Rosslyn, VA, Aug. 10-12, 1999.

V.R. Vathulya and M.H. White, "Characterization of Channel Mobility on Implanted SiC to Determine Polytype Suitability for the Power DIMOS Structure," *Electronic Materials Conference*, Santa Barbara, CA, Jun. 30-Jul. 2, 1999.

V.R. Vathulya, H. Shang, and M.H. White, "A Novel 6H-SiC Power DMOSFET with Implanted P-Well Spacer," *IEEE Electronic Device Letters*, vol. 20, No. 7, Jul. 1999, pp. 354-356.

Williams et al. "Passivation of the 4H-SiC/$SiO_2$ Interface with Nitric Oxide," *Materials Science Forum*. vols. 389-393 (2002), pp. 967-972.

Y. Wang, C. Weitzel, and M. Bhatnagar, "Accumulation-Mode SiC Power MOSFET Design Issues," *Materials Science Forum*, vols. 338-342, pp. 1287-1290.

U.S. Appl. No. 60/435,212, "Vertical JFET Limited Silicon Carbide Power Metal-Oxide Semiconductor Field Effect Transistors and Methods of Fabricating Vertical JFET Limited Silicon Carbide Power Metal-Oxide Semiconductor Field Effect Transistors," filed Dec. 20, 2002.

U.S. Appl. No. 60/294,307, "Method of $N_2O$ Growth on an Oxide Layer on a Silicon Carbide Layer." filed May 31, 2001.

U.S. Appl. No. 10/686,795, "Methods of Forming Power Semiconductor Devices Using Boule-Grown Silicon Carbide Drift Layers and Power Semiconductor Devices Formed Thereby," filed Oct. 16, 2003.

* cited by examiner

SILICON CARBIDE DEVICES WITH HYBRID WELL REGIONS

CLAIM OF PRIORITY

The present application is a divisional of and claims priority from U.S. application Ser. No. 10/873,394, filed Jul. 22, 2004, now U.S. Pat. No. 7,118,970 which is assigned to the assignee of the present application, the disclosure of which is hereby incorporated herein by reference as if set forth fully.

FIELD OF THE INVENTION

This invention relates to methods of fabricating power devices and the resulting devices, and more particularly to silicon carbide power devices and methods of fabricating silicon carbide power devices.

BACKGROUND OF THE INVENTION

Power devices are widely used to carry large currents and support high voltages. Modern power devices are generally fabricated from monocrystalline silicon semiconductor material. One widely used power device is the power Metal Oxide Semiconductor Field Effect Transistor (MOSFET). In a power MOSFET, a control signal is supplied to a gate electrode that is separated from the semiconductor surface by an intervening insulator, which may be, but is not limited to, silicon dioxide. Current conduction occurs via transport of majority carriers, without the presence of minority carrier injection that is used in bipolar transistor operation. Power MOSFETs can provide an excellent safe operating area, and can be paralleled in a unit cell structure.

As is well known to those having skill in the art, power MOSFETs may include a lateral structure or a vertical structure; In a lateral structure, the drain, gate and source terminals are on the same surface of a substrate. In contrast, in a vertical structure, the source and drain are on opposite surfaces of the substrate.

One widely used silicon power MOSFET is the double diffused MOSFET (DMOSFET) which is fabricated using a double-diffusion process. In these devices, a p-base region and an n+ source region are diffused through a common opening in a mask. The p-base region is driven in deeper than the n$^+$ source. The difference in the lateral diffusion between the p-base and n$^+$ source regions forms a surface channel region. An overview of power MOSFETs including DMOSFETs may be found in the textbook entitled "*Power Semiconductor Devices*" by B. J. Baliga, published by PWS Publishing Company, 1996, and specifically in Chapter 7, entitled "*Power MOSFET*", the disclosure of which is hereby incorporated herein by reference.

Recent development efforts in power devices have also included investigation of the use of silicon carbide (SiC) devices for power devices. Silicon carbide has a wide bandgap, a lower dielectric constant, a high breakdown field strength, a high thermal conductivity, and a high saturation electron drift velocity compared to silicon. These characteristics may allow silicon carbide power devices to operate at higher temperatures, higher power levels and with lower specific on-resistance than conventional silicon-based power devices. A theoretical analysis of the superiority of silicon carbide devices over silicon devices is found in a publication by Bhatnagar et al. entitled "*Comparison of 6H—SiC, 3C—SiC and Si for Power Devices*", IEEE Transactions on Electron Devices, Vol. 40, 1993, pp. 645-655. A power MOSFET fabricated in silicon carbide is described in U.S. Pat. No. 5,506,421 to Palmour entitled "*Power MOSFET in Silicon Carbide*" and assigned to the assignee of the present invention.

Notwithstanding these potential advantages, it may be difficult to fabricate power devices including power MOSFETs in silicon carbide. For example, as described above, the double-diffused MOSFET (DMOSFET) is generally fabricated in silicon using a double diffusion process wherein the p-base region is driven in deeper than the n$^+$ source. Unfortunately, in silicon carbide, the diffusion coefficients of conventional p- and n-type dopants are small compared to silicon, so that it may be difficult to obtain the required depths of the p-base and n$^+$ source regions using acceptable diffusion times and temperatures. Ion implantation may also be used to implant the p-base and the n+ source. See, for example, "*High-Voltage Double-Implanted Power MOSFET's in 6H—SiC*" by Shenoy et al., IEEE Electron Device Letters, Vol. 18, No. 3, March 1997, pp. 93-95. However, it may be difficult to control the depth and lateral extent of ion implanted regions. Moreover, the need to form a surface channel surrounding the source region may require the use of two separate implantation masks. It may then be difficult to align the p-base and the source regions to one another, thereby potentially impacting the device performance.

Methods of forming FETs in silicon carbide utilizing p-type implantation have also been described by, for example, commonly assigned U.S. Pat. No. 6,107,142 entitled "*Self-Aligned Method of Fabricating Silicon Carbide Power Devices by Implantation and Lateral Diffusion,*" the disclosure of which is incorporated herein by reference as if set forth fully herein. Also, PCT International Publication No. WO98/02916 describes a method for producing a doped p-type channel region layer having, on laterally opposite sides thereof, doped n-type regions in a silicon carbide layer for producing a voltage-controlled semiconductor device. A masking layer is applied on top of a silicon carbide layer that is lightly n-doped. An aperture is etched in the masking layer extending to the silicon carbide layer. N-type dopants are implanted into an area of the silicon carbide layer defined by the aperture for obtaining a high doping concentration of n-type in the surface-near layer of the silicon carbide layer under the area. P-type dopants having a considerably higher diffusion rate in silicon carbide than the n-type dopants, are implanted into an area of the silicon carbide layer defined by the aperture to such a degree that the doping type of the surface-near layer is maintained. The silicon carbide layer is then heated at such a temperature that the p-type dopants implanted in the surface-near layer diffuse into the surrounding regions of the silicon carbide layer that is lightly n-doped, to such a degree that a channel region layer in which p-type dopants dominates is created laterally to the highly doped n-type surface-near layer and between this layer and lightly n-doped regions of the silicon carbide layer.

Silicon carbide MOSFETs that are formed without the use of p-type implantation are described in commonly assigned U.S. Pat. No. 6,429,041, entitled "Silicon Carbide Inversion Channel MOSFETs" the disclosure of which is incorporated herein by reference as if set forth in its entirety.

SUMMARY OF THE INVENTION

Some embodiments of the present invention provide for fabricating a silicon carbide MOSFET including forming a hybrid p-type silicon carbide well region on a silicon carbide substrate having a drift region. The hybrid p-type silicon carbide well region includes an implanted p-type silicon carbide well portion in a p-type silicon carbide epitaxial layer, an implanted p-type silicon carbide contact portion that contacts the implanted p-type silicon carbide well portion and extends to a surface of the p-type epitaxial layer and an epitaxial p-type silicon carbide portion, at least a portion of the epitaxial p-type silicon carbide portion corresponding to a p-type channel region of the MOSFET. Fabrication of the MOSFET also includes forming a first n-type silicon carbide region. The first n-type silicon carbide region is, at least in part, within the hybrid p-type silicon carbide well region. Fabrication of the MOSFET also includes forming a second n-type silicon carbide region adjacent the p-type channel region and extending to a drift region to provide an n-type channel region and forming a gate dielectric on the second n-type silicon carbide and at least a portion of the first n-type silicon carbide region. A gate contact is formed on the gate dielectric. A first contact is formed so as to contact a portion of the contact portion of the hybrid p-type silicon carbide well region the first n-type silicon carbide region. A second contact is formed on the substrate.

In further embodiments of the present invention where the drift region is a n-type silicon carbide drift region, forming a hybrid p-type silicon carbide region includes forming a p-type silicon carbide epitaxial layer on the n-type silicon carbide drift region, forming a buried p-type silicon carbide region in the p-type silicon carbide epitaxial layer, the buried p-type region having a higher carrier concentration than a carrier concentration of the p-type epitaxial layer and forming a second p-type silicon carbide region in the p-type silicon carbide epitaxial region that extends from the buried p-type region to a surface of the p-type silicon carbide epitaxial layer. Forming a buried p-type silicon carbide region may be provided by forming a first ion implantation mask on the p-type silicon carbide epitaxial layer implanting p-type dopants in the p-type epitaxial layer utilizing the first ion implantation mask. The first ion implantation mask has an opening corresponding to a location of the buried p-type silicon carbide region. Forming a first n-type silicon carbide region may be provided by implanting n-type dopants in the p-type epitaxial layer utilizing the first ion implantation mask.

In additional embodiments of the present invention, forming a second p-type silicon carbide region is provided by forming a second ion implantation mask on the p-type silicon carbide epitaxial layer and implanting p-type dopants in the p-type epitaxial layer utilizing the second ion implantation mask. The second ion implantation mask has an opening corresponding to a location of the second p-type silicon carbide region. Furthermore, forming a second n-type silicon carbide region may be provided by forming a third ion implantation mask on the p-type silicon carbide epitaxial layer and implanting n-type dopants in the p-type epitaxial layer utilizing the third ion implantation mask. The third ion implantation mask has an opening corresponding to a location of the second n-type silicon carbide region.

In additional embodiments of the present invention, fabrication of the MOSFET includes activating the implanted n-type and p-type dopants by exposing the p-type epitaxial layer to a temperature of from about 1200° C. to about 1800° C. Activating the implanted n-type and p-type dopants may be preceded by capping exposed portions of the p-type epitaxial layer with a passivating material. Forming a gate dielectric may be provided by patterning the passivating material so as to provide the gate dielectric. A voltage absorbing region may be formed around the silicon carbide device DMOSFET.

In further embodiments of the present invention, the drift region comprises an n-type silicon carbide epitaxial layer on the silicon carbide substrate and the p-type epitaxial layer is formed on the n-type silicon carbide epitaxial layer.

In other embodiments of the present invention, fabrication of a silicon carbide power device includes forming a first p-type silicon carbide epitaxial layer on an n-type silicon carbide drift region on an n-type silicon carbide substrate, forming at least one first region of n-type silicon carbide through the first p-type silicon carbide epitaxial layer and extending to the n-type silicon carbide drift region so as to provide at least one channel region in the first p-type silicon carbide epitaxial layer, forming at least one second region of n-type silicon carbide in the first p-type silicon carbide epitaxial layer which is adjacent and spaced apart from the first region of n-type silicon carbide and implanting p-type dopants in the p-type silicon carbide epitaxial layer to form at least one buried region of p-type silicon carbide in the first p-type silicon carbide epitaxial layer. The buried region has a higher carrier concentration than the p-type silicon carbide epitaxial layer and is positioned between the second region of n-type silicon carbide and the drift region and is substantially aligned with a side of the second region of n-type silicon carbide adjacent the first region of n-type silicon carbide. P-type dopants are also implanted in the p-type silicon carbide epitaxial layer to form at least one contact region of p-type silicon carbide that extends through the second region of n-type silicon carbide to the buried region of p-type silicon carbide. A gate dielectric is formed on the first region of n-type silicon carbide and at least a portion of the second region of n-type silicon carbide.

In still further embodiments of the present invention, fabrication of the silicon carbide power device includes forming a gate contact on the gate dielectric, forming a first contact so as to contact a portion of the contact region of p-type silicon carbide and the second region of n-type silicon carbide and forming a second contact on the substrate.

In some embodiments of the present invention, forming at least one second region of n-type silicon carbide and implanting p-type dopants in the p-type silicon carbide epitaxial layer to form at least one buried region is provided by patterning a first mask layer on the p-type epitaxial layer, the first mask layer having an opening corresponding to the at least one second region of n-type silicon carbide and the at least one buried region, implanting p-type dopants utilizing the patterned first mask layer to provide the at least one buried region and implanting n-type dopants utilizing the patterned first mask layer to provide the at least one second region of n-type silicon carbide. Implanting n-type dopants and implanting p-type dopants in the p-type silicon carbide epitaxial layer may be followed by activating the implanted n-type dopants and p-type dopants. Activating the implanted n-type dopants and p-type dopants may be provided by exposing the implanted first p-type epitaxial layer to a temperature of from about 1200° C. to about 1800° C. Exposing the implanted first p-type epitaxial layer may be preceded by capping exposed portions of the first p-type epitaxial layer with a passivating material. Forming a gate dielectric may be provided by patterning the passivating material so as to provide the gate dielectric.

In further embodiments of the present invention, implanting p-type dopants in the p-type silicon carbide epitaxial layer to form at least one contact region of p-type silicon carbide is provided by forming a second mask layer on the p-type silicon carbide epitaxial layer, the second mask layer having an opening corresponding to a location of the at least one contact region and implanting p-type dopants in the p-type epitaxial layer utilizing the second mask layer. Additionally, forming at least one second region of n-type silicon carbide region may be provided by forming a third mask layer on the p-type silicon carbide epitaxial layer, the third mask layer having an opening corresponding to a location of the at least one second region of n-type silicon carbide and implanting n-type dopants in the p-type epitaxial layer utilizing the third mask layer.

Fabrication of the silicon carbide power device may also include forming a voltage absorbing region around the silicon carbide device. An n-type silicon carbide epitaxial layer may also be formed on the silicon carbide substrate, the n-type silicon carbide epitaxial layer providing the n-type drift region. Furthermore, the buried region may extend to the drift region.

Additional embodiments of the present invention provided a vertical silicon carbide MOSFET that includes a hybrid p-type silicon carbide well region on a silicon carbide substrate, an n-type silicon carbide source region in the hybrid p-type silicon carbide well region, an n-type silicon carbide channel region adjacent and spaced apart from the n-type silicon carbide source region and a gate dielectric on the n-type silicon carbide channel region and at least a portion of the n-type silicon carbide source region. A gate contact is provided on the gate dielectric. A first contact is provided on a portion of the hybrid p-type silicon carbide well region and the n-type silicon carbide source region. A second contact is provided on the substrate.

In still further embodiments of the present invention, the hybrid p-type silicon carbide well region includes an implanted p-type silicon carbide well portion in a p-type silicon carbide epitaxial layer, an implanted p-type silicon carbide contact portion that contacts the implanted p-type silicon carbide well portion and extends to a surface of the p-type epitaxial layer and an epitaxial p-type silicon carbide portion of the p-type silicon carbide epitaxial layer, at least a portion of which corresponds to a p-type channel region of the MOSFET. An n-type epitaxial layer may also be provided between the hybrid p-type silicon carbide well region and the substrate.

In some embodiments of the present invention, the n-type source region and the n-type channel region include regions of the p-type epitaxial layer with implanted n-type dopants. Furthermore, a voltage absorbing region may be provided around the silicon carbide device MOSFET. A passivating layer may also be provided on exposed portions of the p-type epitaxial layer.

In other embodiments of the present invention, a unit cell of a vertical silicon carbide power device includes a first p-type silicon carbide epitaxial layer on an n-type silicon carbide drift region on an n-type silicon carbide substrate, at least one first region of n-type silicon carbide which extends through the first p-type silicon carbide epitaxial layer to an n-type drift region, at least one second region of n-type silicon carbide which is adjacent and spaced apart from the first region of n-type silicon carbide and at least one implanted buried region of p-type silicon carbide in the first p-type silicon carbide epitaxial layer. The implanted buried region has a higher carrier concentration than the p-type silicon carbide epitaxial layer, is positioned between the at least one second region of n-type silicon carbide and the drift region and is substantially aligned with a side of the second region of n-type silicon carbide adjacent the first region of n-type silicon carbide. A gate dielectric is provided over the first region of n-type silicon carbide in the first p-type silicon carbide layer and at least a portion of the second region of n-type silicon carbide.

In further embodiments of the present invention, the unit cell includes at least one contact region of p-type silicon carbide that extends through the at least one second region of n-type silicon carbide to the at least one buried region of p-type silicon carbide. Additionally, a gate contact may be provided on the gate dielectric. A first contact may be provided so as to contact a portion of the contact region and the second region of n-type silicon carbide. A second contact may be provided on the substrate.

In additional embodiments of the present invention, an n-type epitaxial layer is provided between the first p-type silicon carbide epitaxial layer and the substrate. The first and second regions of n-type silicon carbide may be regions of the first p-type epitaxial layer with implanted n-type dopants. A trench may be provided in the first p-type epitaxial layer and the first region of n-type silicon carbide may include a region of n-type silicon carbide adjacent a sidewall of the trench. A passivating layer may be provided on exposed portions of the first p-type epitaxial layer. A voltage absorbing region may also be provided around the silicon carbide device.

Still further embodiments of the present invention provide methods of fabricating a silicon carbide Metal-Oxide Semiconductor (MOS) gated device and such devices by forming a hybrid silicon carbide well region of a first conductivity type. Forming the hybrid silicon carbide well region includes forming a first silicon carbide epitaxial layer of a first conductivity type, implanting a ions in the silicon carbide epitaxial layer to provide an implanted well portion of the first conductivity type in the silicon carbide epitaxial layer and implanting ions in the silicon carbide epitaxial layer to provide an implanted contact portion that contacts the implanted well portion and extends to a surface of the epitaxial layer. A first silicon carbide region of a second conductivity type is formed at least in part within the hybrid silicon carbide well region. A second silicon carbide region of the second conductivity type is formed adjacent the well region and spaced apart from the first silicon carbide region. A gate dielectric is formed on the second silicon carbide region and at least a portion of the first silicon carbide region and a gate contact is formed on the gate dielectric. An unimplanted portion of the epitaxial layer corresponds to a channel region of the device.

In additional embodiments of the present invention, the first conductivity type is p-type and the second conductivity type is n-type. In other embodiments of the present invention, the first conductivity type is n-type and the second conductivity type is p-type.

In some embodiments of the present invention, the epitaxial layer is formed on a drift region of the second conductivity type and the first region of silicon carbide extends to the drift region to provide a field effect transistor. The drift region may be an epitaxial layer of silicon carbide and/or a silicon carbide substrate.

In other embodiments of the present invention, the epitaxial layer is formed on a layer of first conductivity type silicon carbide and the first region of silicon carbide extends to the layer of first conductivity type silicon carbide to provide an insulated gate bipolar transistor. The layer of first conductivity silicon carbide may be an epitaxial layer of silicon carbide and/or a silicon carbide substrate.

DETAILED DESCRIPTION OF PREFERRED EMBODIMENTS

The present invention now will be described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. In the drawings, the size and relative sizes of layers and regions may be exaggerated for clarity. It will be understood that when an element or layer is referred to as being "on", "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numbers refer to like elements throughout. As used herein, the term "and/or" includes any and all combinations of one or more of the associated listed items.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Furthermore, relative terms, such as "lower" or "bottom" and "upper" or "top," may be used herein to describe one element's relationship to another elements as illustrated in the Figures. It will be understood that relative terms are intended to encompass different orientations of the device in addition to the orientation depicted in the Figures. For example, if the device in the Figures is turned over, elements described as being on the "lower" side of other elements would then be oriented on "upper" sides of the other elements. The exemplary term "lower", can therefore, encompasses both an orientation of "lower" and "upper," depending of the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

Embodiments of the present invention are described herein with-reference to cross-section illustrations that are schematic illustrations of idealized embodiments of the present invention. As such, variations from the shapes of the illustrations as a result, for example, of manufacturing techniques and/or tolerances, are to be expected. Thus, embodiments of the present invention should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the precise shape of a region of a device and are not intended to limit the scope of the present invention.

Embodiments of the present invention are described with reference to a particular polarity conductivity type for various layers/regions. However, as will be appreciated by those of skill in the art, the polarity of the regions/layers may be inverted to provide an opposite polarity device.

Some embodiments of the present invention prevention provide vertical power MOSFETs and/or IGBTs that include a hybrid well region of silicon carbide. As used herein, the term "hybrid well region" refers to a well region of a silicon carbide device that includes both epitaxially formed regions and implanted regions. As is known to those of skill in the art, doped regions of silicon carbide may be formed through epitaxial growth and/or through implantation. For example, a p-type region of silicon carbide may be formed through epitaxial growth in the presence of a p-type dopant or through implantation of p-type dopants in an undoped, p-type or n-type epitaxial layer. The structure that results from epitaxial growth differs from that that results from implantation. Thus, the terms "epitaxial region" and "implanted region" structurally distinguish differing regions of silicon carbide and may be used herein as a recitation of structural characteristics of the regions of silicon carbide and/or as recitations of methods of forming such regions of silicon carbide.

While embodiments of the present invention are described with reference to MOSFETs and IGBTs, hybrid well regions may be used in other devices, the as light doped MOSFETs (LDMOSFETs) or other such devices. Accordingly, some embodiments of the present invention may include any MOS gated device having a hybrid well region as described herein with reference to the MOSFETs and/or IGBTs.

Figure 1:
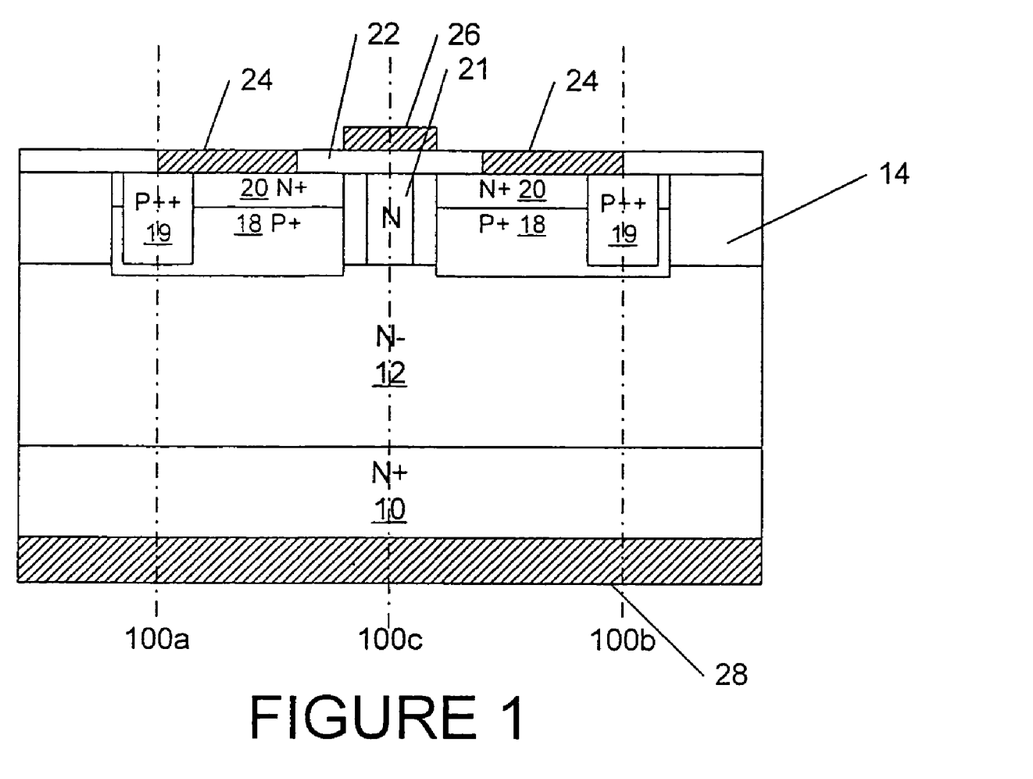
FIG. 1 is a cross-sectional view of a power MOSFET of some embodiments of the present invention.

Referring now to FIG. 1, embodiments of a vertical power MOSFET and unit cell of a vertical power MOSFET are illustrated. It will be understood by those having skill in the art that the vertical silicon carbide MOSFETs are generally replicated in a unit cell. Such unit cells are illustrated between lines 100a and 100c or lines 100b and 100c. For ease of illustration, a two unit cell MOSFET will be described, however, as will be appreciated by those of skill in the art, additional unit cells may be incorporated into a MOSFET along one direction or along two, generally orthogonal directions, while still benefiting from the teachings of the present invention.

As is seen in FIG. 1, a MOSFET of some embodiments of the present invention includes an $n^+$ monocrystalline silicon carbide substrate 10. An $n^-$ silicon carbide layer 12 is provided on a first face of the substrate 10. A p-type epitaxially formed silicon carbide region 14 is on the n-type layer 12 and may provide a p-well region. A buried region 18 of $p^+$ silicon carbide is provided in the p-well region 14 beneath an $n^+$ region 20 of silicon carbide that is also provided in the p-type epitaxial region 14. The $n^+$ region 20 may provide a source region of the device. A $p^{++}$ region 19 extends from a face of the p-well region 14 to the buried region 18 and may provide a contact region. Adjacent and spaced apart from the $n^+$ source region 20 is an n-type silicon carbide region 21 that extends to the $n^-$ layer 12. The n-type silicon carbide region 21 may provide an n-type channel region. A region of the epitaxial p-well region 14 between the $n^+$ source region 20 and may provide a p-type silicon carbide channel region. A gate insulating layer 22 of a suitable dielectric material, such as $SiO_2$, extends over the channel region 21 and to the $n^+$ source regions 20. A gate contact 26 is provided on the gate layer opposite the channel region 21. Source contact 24 is provided between the $p^{++}$ contact regions 19 and the $n^+$ source regions 20 and drain contact 28 is provided on the face of the substrate 10 opposite the p-type epitaxial region 14.

In some embodiments of the present invention, an n⁻ silicon carbide substrate 10 may be used and the silicon carbide layer 12 may be omitted. An n⁺ epitaxial layer and/or backside implant of the substrate 10 may be provided and the drain contact 28 may be provided on the epitaxial layer/implanted region. Thus, the MOS gate and hybrid well structure according to embodiments of the present invention may be utilized with devices such as those described in commonly assigned U.S. patent application Ser. No. 10/686,795, filed Oct. 16, 2003 and entitled "METHODS OF FORMING POWER SEMICONDUCTOR DEVICES USING BOULE-GROWN SILICON CARBIDE DRIFT LAYERS AND POWER SEMICONDUCTOR DEVICES FORMED THEREBY", the disclosure of which is incorporated herein by reference as if set forth fully herein.

The increased doping concentration of the buried p-type region 18 over the p-type epitaxial region may avoid punch through between the n-type region 14 and the drift layer 12. The buried p-type region, in some embodiments, is between the n-type region 20 and the drift layer 12. Furthermore, the p-type region 18 may be substantially aligned with the side of n-type region 20 adjacent the n-type channel region 21. In particular, in some embodiments of the present invention, the p-type region 18 extends to but not past the edge of the n-type region 20.

By providing a hybrid p-type well region that includes an implanted buried p-type region 18 and an epitaxial p-type channel region, a planar MOSFET may be provided. Planar MOSFETs may be easier to fabricate and may have improved reliability over non-planar devices. Furthermore, because the buried p-type region 18 does not extend substantially into the p-type channel region, the p-type channel region may be provided without degradation caused by ion implantation. Furthermore, typically carrier mobility is inversely related to p-type doping such that the higher the doping, the lower the carrier mobility. By providing different doping for the p-type channel region and the p-type buried region, the likelihood of punch through may be reduced without substantially reducing the carrier mobility in the channel region. Thus, for example, it is expected that devices of some embodiments of the present invention may have a mobility as high as 50 $cm^2NV$-s.

Optionally, a voltage absorbing region may be provided that distributes the electric field at the perimeter of the MOSFET so as to reduce field crowding. In particular, the voltage absorbing region may be formed by forming a step or steps in the p-type epitaxial region 14. Such a step may form a mesa having a sidewall that surrounds the device. Furthermore, a p⁻ region may be formed at the periphery of the device to further distribute the electric field. Formation of such a voltage absorbing region and alternative embodiments of such a voltage absorbing region are described in further detail below. However, the present invention should not be construed as limited to a particular voltage absorbing region configuration. For example, multiple steps in the p-type epitaxial layer 14 may be provided. Similarly, the p⁻ region formed at the periphery of the device may be graded to further distribute the electric field.

In embodiments of the present invention having a voltage absorbing region, the voltage absorbing region may have one or more steps so as to gradually reduce the thickness of the p-type epitaxial layer 14. The thickness of the p-type epitaxial layer 14 in the region of the steps may be reduced so that the product of the thickness and the doping of the carrier concentration of the p-type epitaxial layer 14 is between about $1\times10^{12}$ $cm^{-2}$ and about $1\times10^{13}$ $cm^{-2}$. Regions of p⁻ silicon carbide may be formed in the p-type epitaxial layer 14 through, for example, ion implantation techniques known to those of skill in the art. Such implantation may be accomplished by masking and then implanting n-type dopants to compensate a region of the p-type epitaxial layer 14 utilizing techniques known to those of skill in the art. The distance between the contact regions 18 and the regions of p⁻ silicon carbide may be based on the desired breakdown voltage of the device. For example, a distance of about 150 μm may be suitable for a 2 kV device. As will be appreciated by those of skill in the art, other distances may be utilized while benefiting from the teachings of the present invention.

The voltage absorbing region may also be etched to isolate the device. Such an etching process may etch through the p-type epitaxial layer 14 to the n-type epitaxial layer 12 so as to form a mesa having a sidewall that extends to and/or into the n-type epitaxial layer 12. Alternatively, the sidewall of the mesa could extend through the n-type epitaxial layer 12 and to and/or into the substrate 10. Preferably, the sidewall of the mesa extends through the voltage absorbing p⁻ region at a distance from the source contact region 18 based upon the desired breakdown voltage of the device as described above. Alternatively, the voltage absorbing region may be formed by masking and selective epitaxial growth of the epitaxial layer 14. In such an embodiment of the present invention, the formation of the structure of FIG. 2 discussed below would be modified to incorporate the selective epitaxial growth process.

Figure 2:
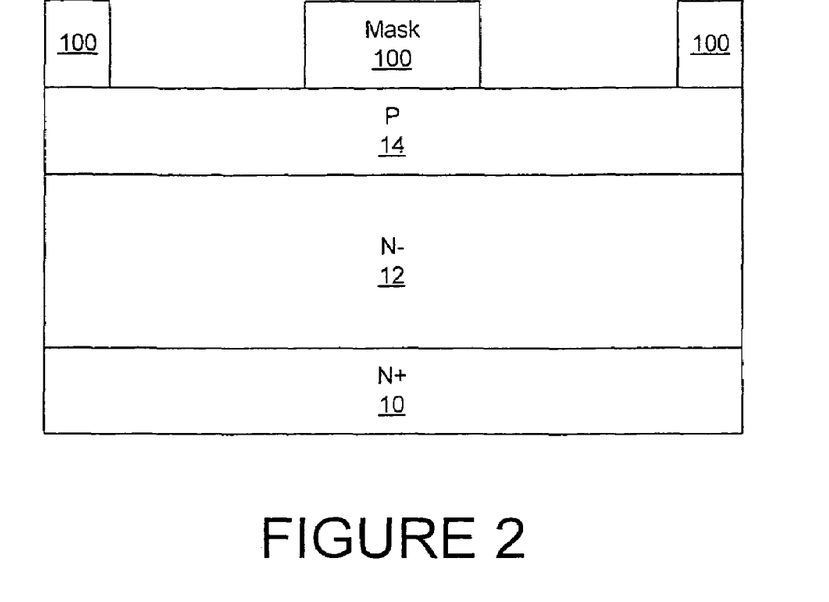
FIGS. 2 through 11 are cross-sectional views illustrating methods for producing the power MOSFET of FIG. 1 of some embodiments of the present invention.

Methods of fabrication of some embodiments of the present invention will now be described. As seen in FIG. 2, an n⁻ epitaxial layer 12 is formed on a n⁺ silicon carbide substrate 10. The n⁻ layer 12 may have a thickness of from about 5 to about 200 μm and a doping to provide a carrier concentration of from about $1\times10^{14}$ $cm^{-3}$ to about $1\times10^{17}$ $cm^{-3}$. In particular embodiments of the present invention, the n-layer 12 is about 12 μm thick and is doped to provide a carrier concentration of about $5\times10^{15}$ $cm^{-3}$. A p-type epitaxial layer 14 is then grown on the n⁻ epitaxial layer 12. The p-type epitaxial layer 14 may have a thickness of from about 0.5 to about 3 μm and a doping to provide a carrier concentration of from about $2\times10^{16}$ $cm^{-3}$ to about $5\times10^{17}$ $cm^{-3}$. In particular embodiments of the present invention, the p-type epitaxial layer 14 is about 0.5 μm thick and is doped to provide a carrier concentration of about $1\times10^{16}$ $cm^{-3}$. A mask layer 100 is formed on the p-type epitaxial layer 14 and patterned to form openings corresponding to the source regions 20 and the buried p-type regions 18 of the device.

Figure 3:
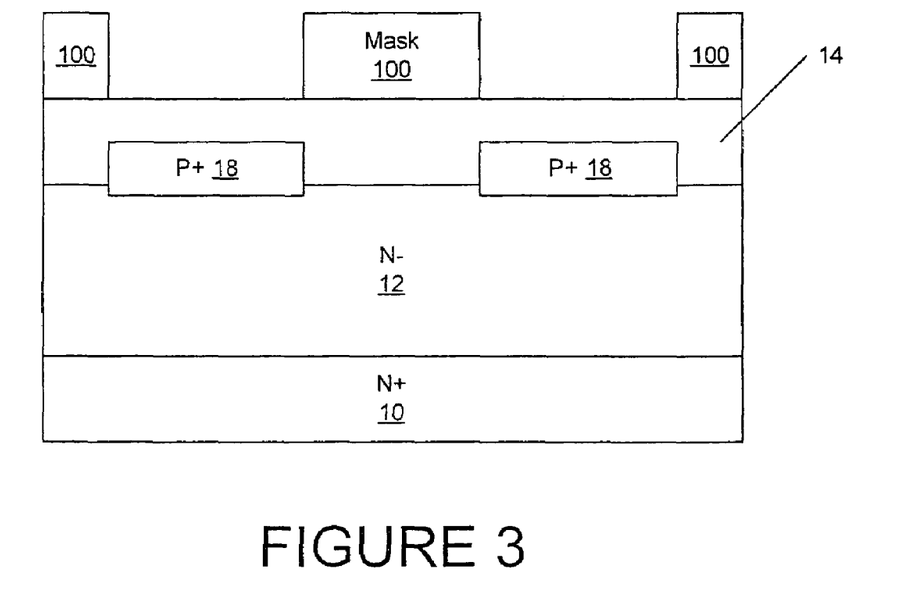
Figure 4:
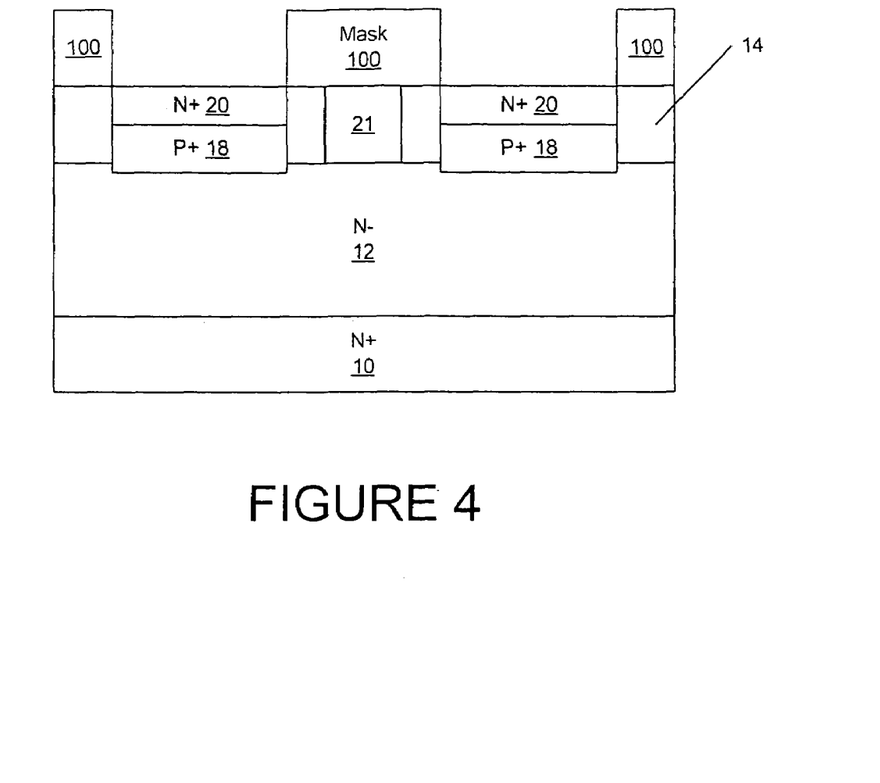

As seen in FIGS. 3 and 4 the buried p-type regions 18 and the source regions 20 may be formed by patterning a mask layer 100 having openings corresponding to the location of the source regions 20. The buried p-type regions 18 are formed by ion implantation of p-type dopants using the patterned mask 100. The buried p-type regions 18 may extend to and, in some embodiments, into the drift region (e.g., n-type epitaxial layer 12). The p-type dopant may be aluminum or other suitable p-type dopant. In certain embodiments of the present invention, the p-type region 18 has a thickness of less than about the thickness to which the region 21 may be formed, for example, from about 0.2 μm to about 1 μm. In particular embodiments of the present invention, the buried p-type regions 18 extend from a depth of about 0.2 μm to a depth of about 0.7 μm from the surface of the p-type epitaxial layer 14. Furthermore, the p-type region 18 may be doped to provide a carrier concentration of from about $10^{17}$ $cm^{-3}$ to about $10^{18}$ $cm^{-3}$. In particular embodiments of the present invention, the p-type region 18 may be doped to provide a carrier concentration of about $1\times10^{18}$ cm$^{-3}$.

As seen in FIG. 4, the source regions 20 are formed by implanting n-type dopants into the p-type epitaxial layer 14 utilizing the patterned mask 100. The n-type dopant utilized for all n-type implants may be nitrogen and/or phosphorous, however, other n-type dopants may also be utilized. The n-type source regions 20 may extend a distance of from about 0.2 μm to about 0.3 μm into the p-type epitaxial layer. The n-type source regions may be doped to provide a carrier concentration sufficient to allow for formation of a good ohmic contact. In particular embodiments of the present invention, the n-type source regions extend to a depth of about 0.2 μm into the p-type epitaxial layer and are doped to provide a carrier concentration of about $1\times10^{19}$ cm$^{-3}$.

While embodiments of the present invention are described using the same windows in the patterned mask 100 for implantation of both the p-type regions 18 and the source regions 20, in some embodiments of the present invention different size windows may be used to compensate for straggle in the implantation.

Figure 5:
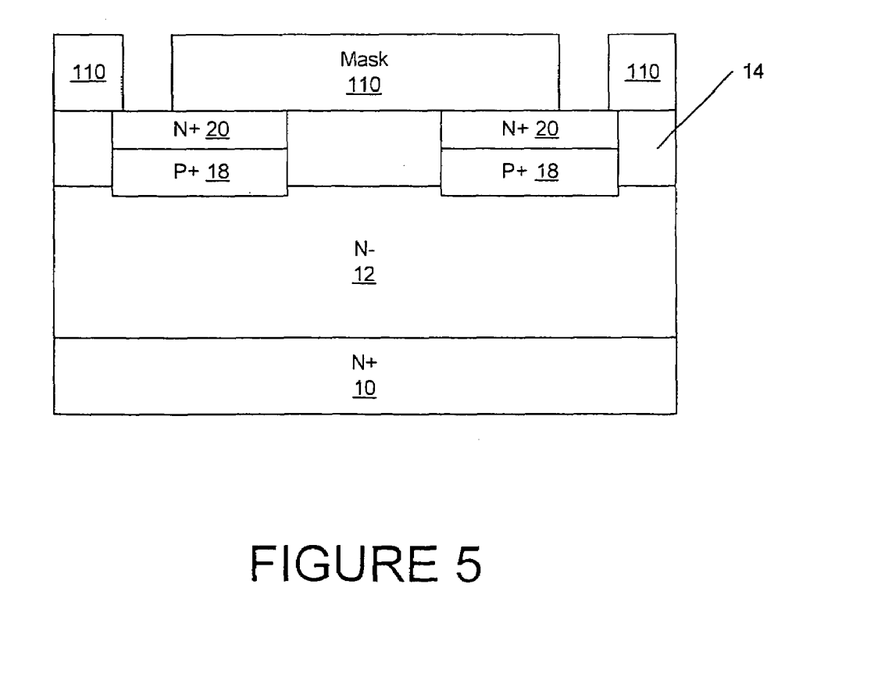
Figure 6:
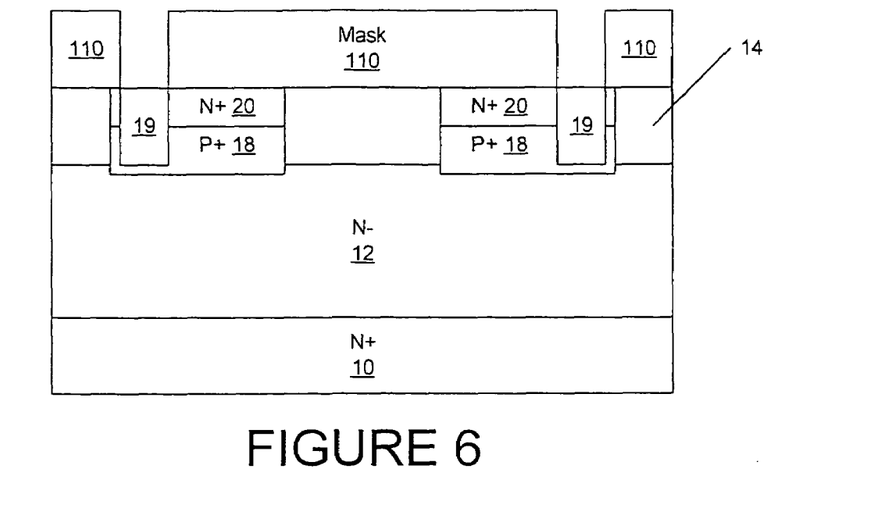

As seen in FIGS. 5 and 6, the mask 110 is removed and an additional mask 110 is formed and patterned to provide an opening corresponding to the contact regions 19. The p-type contact regions 19 are formed by ion implantation utilizing the patterned mask 130. The contact regions 19 may extend from the surface of the epitaxial layer 14 to the buried p-type region 18 and may be doped to provide a carrier concentration of from about $5\times10^{18}$ to about $1\times10^{21}$ cm$^{-3}$. In particular embodiments of the present invention, the contact regions 19 have a carrier concentration of about $1\times10^{19}$ cm$^{-3}$ and extend to a depth of about 0.4 μm into the p-type epitaxial layer 14.

Figure 7:
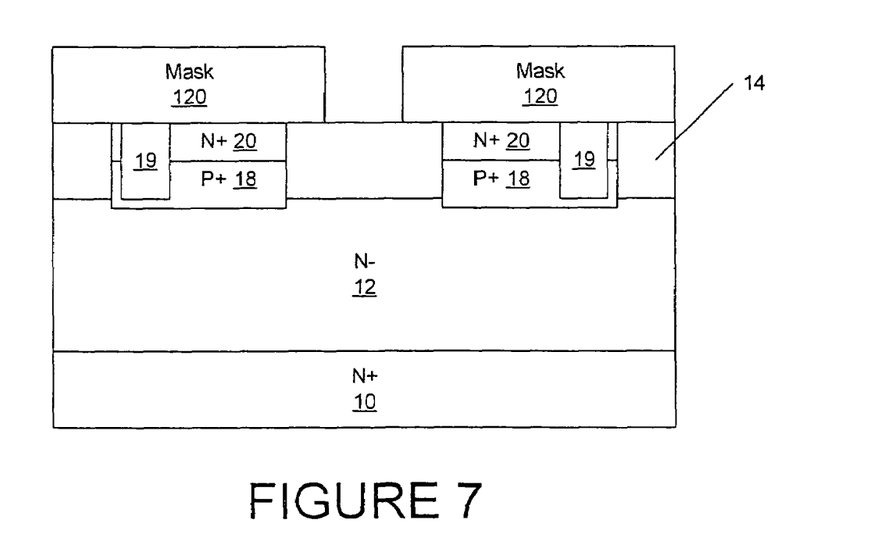
Figure 8:
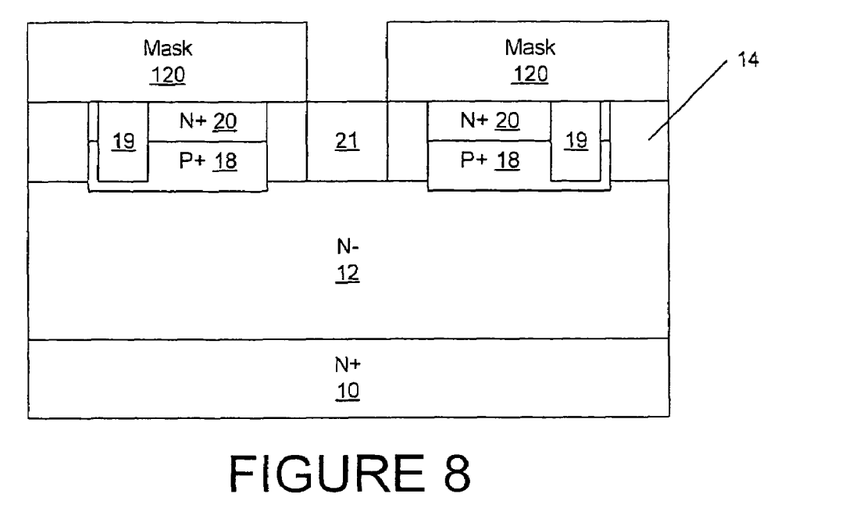

FIGS. 7 and 8 illustrate formation of the channel region 21 of some embodiments of the present invention. As seen in FIG. 7, the mask 110 is removed an additional mask layer 120 is patterned to have opening corresponding to the contact regions 19. As seen in FIG. 8, the channel region 21 may be formed by implanting n-type dopants in the p-type epitaxial layer 14 utilizing the patterned mask 120 so as to form the channel region 21 that extends through the p-type epitaxial layer 14 to the drift region (e.g., the n-type epitaxial layer 12). When the device is turned-on, this n-type channel can region provide a path from the MOS channel to the lightly doped drift region, allowing electrons to flow from source regions to drain regions. In the off-state, this n-channel region may be depleted of electrons from the reverse biased pn junction, which is formed on both sides of the channel region. The pn-junctions on both sides of the channel region may shield the MOS region from high electric fields at off state, which may result in a higher device reliability compared to trench devices, such as UMOSFETs.

Any suitable n-type dopants may be utilized. In some embodiments of the present invention, nitrogen is utilized as the n-type dopant. The carrier concentration of the n-type channel 21 in some embodiments of the present invention is from 1 to 200% that of the p-type epitaxial layer 14 and in particular embodiments of the present invention from 30 to 50% (e.g about $1\times10^{16}$). The n-type channel 21 extends through the p-type epitaxial region to the drift region. In particular embodiments, the n-type channel 21 extends about 0.5 μm into the p-type epitaxial region.

In an alternative embodiment of the present invention, the channel region 21 may also be formed by first etching a trench in the p-type epitaxial layer and then implanting n-type dopants in the exposed portions (the bottom and sidewalls) of the trench so as to provide the channel region 21. Similar carrier concentrations to those discussed above with reference to FIG. 3 may be utilized.

Figure 9:
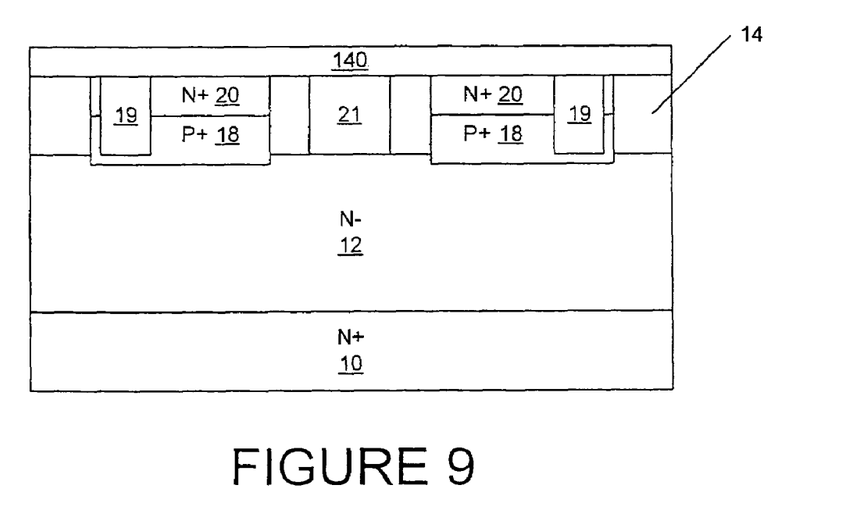

FIG. 9 illustrates formation of an optional cap layer 140 of a deposited oxide and/or other passivating material. The cap layer 140 may have a thickness of from about 0.01 μm to about 1 μm. In any event, whether a cap layer 140 is utilized or not, the device may be exposed to a high temperature anneal ranging from about 900° C. to about 1800° C. and in some embodiments, about 1600° C. for several minutes, such as five minutes, so as to activate the n-type and p-type implants.

Figure 10:
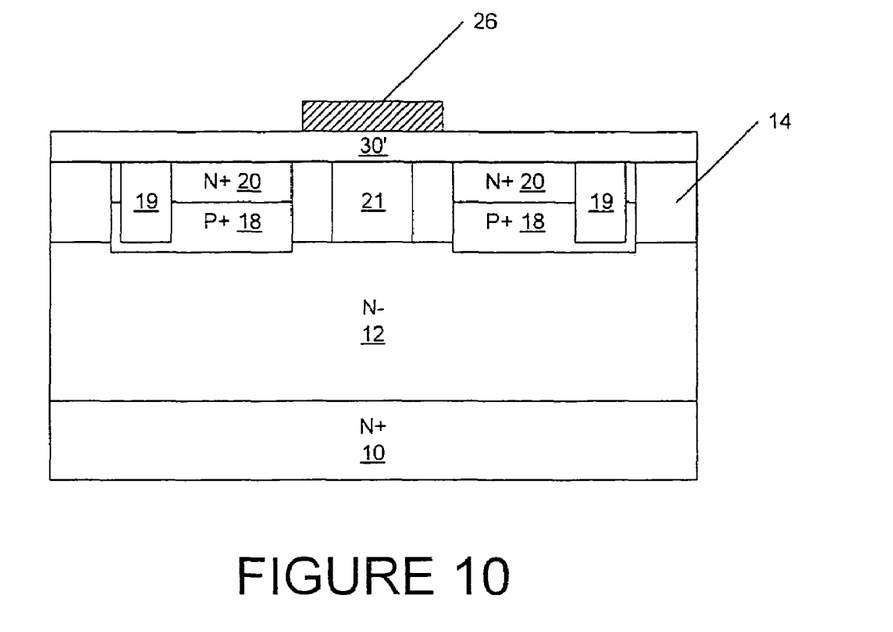

As illustrated in FIG. 10, after the anneal, the cap layer 140 may be stripped off of the device and a layer 30' of dielectric material deposited on the device so as to provide a gate dielectric material. Alternatively, the cap layer 140 may be used as the gate dielectric material. In some embodiments of the present invention, the dielectric material and/or the cap layer may be formed as described in U.S. Pat. No. 6,610,366, entitled "Method of N$_2$O annealing an oxide layer on a silicon carbide layer", United States Patent Application Publication No. US2002/0072247A1, entitled "Method of N$_2$O growth of an oxide layer on a silicon carbide layer" and/or United States Patent Application Publication No. US2002/0102358A1, entitled "Method of fabricating an oxide layer on a silicon carbide layer utilizing an anneal in a hydrogen environment", the disclosures of which are incorporated herein as if set forth in their entirety. In either case, a gate contact 26 may be formed by forming a metal contact on the gate dielectric material. Suitable gate contact materials include, but are not limited to, aluminum, polysilicon and molybdenum. Furthermore, as will be appreciated by those of skill in the art, a multi-layered gate contact may also be utilized.

Figure 11:
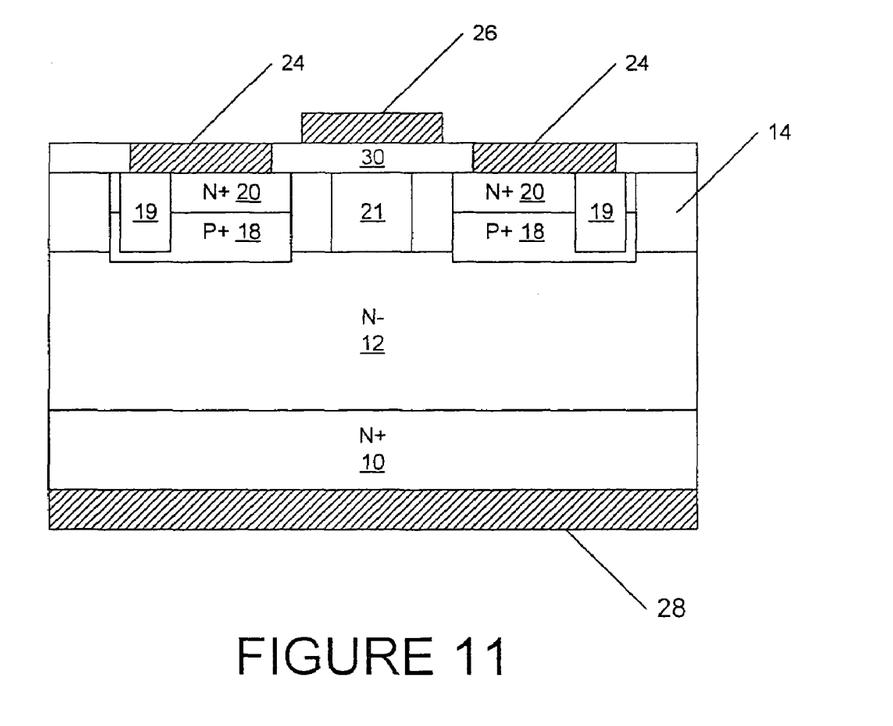

As is illustrated in FIG. 11, contact holes may be formed in the dielectric material 30' and ohmic contacts formed in the contact holes to provide source contacts 24. Similarly, an ohmic contact 28 may be formed on the substrate 10. Suitable ohmic contact materials include, but are not limited to, nickel, titanium alloy, and aluminum. The deposited metal contacts may then be sintered at a high temperature ranging from about 500° C. to about 1200° C. An overlayer metal may also be deposited on the contacts, for example, to facilitate connection to the device.

It will be understood by those having skill in the art that the order of steps in FIGS. 2-11 may be changed. Thus, for example, the channel region 21 of FIG. 8 may be formed before forming the n$^+$ regions 20 of FIG. 4. Similarly, the buried p$^+$ regions 18 and/or the contact regions 19 may be formed either before or after formation of the n$^+$ regions 20 or channel region 21. Similarly, the contacts 24 may be formed by, for example, depositing and patterning a metal layer, and then the dielectric layer 140 provided and openings in the dielectric layer formed to the contacts 24. Accordingly, the present invention should not be construed as limited to the exact sequence of operations described herein but is intended to encompass other sequences of fabrication that will become apparent to those of skill in the art in light of the present disclosure.

Figure 12:
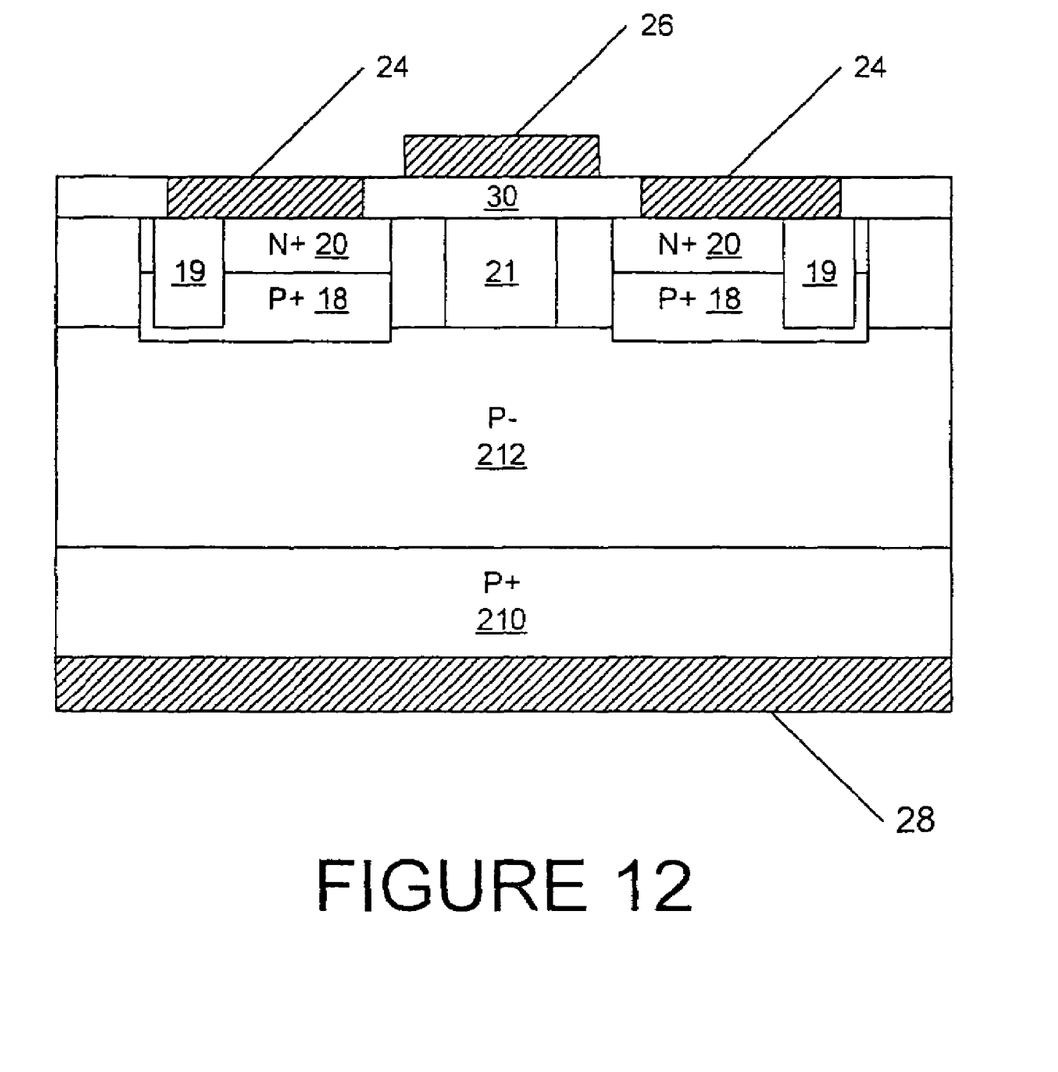
FIG. 12 is a cross-sectional view of an Insulated gate Bipolar Transistors (IGBTs) according to some embodiments of the present invention.

FIG. 12 illustrates further embodiments of the present invention where a MOS gated device having a hybrid well region is provided as an IGBT. As seen in FIG. 12, by utilizing a p-type substrate 210 and a p-type epitaxial layer 212, the structure illustrated in FIG. 1 may be provided as an IGBT. Alternatively, if an n-type substrate and epitaxial layer are used, the epitaxial layer 14 and the implanted regions 19 and 18 may be n-type and the implanted regions 20 and 21 may be p-type. The devices of FIG. 12 may be fabricated substantially as describe above with reference to FIGS. 2 through 11 except for the various modifications to conductivity type mentioned above.

In the drawings and specification, there have been disclosed typical preferred embodiments of the invention and, although specific terms are employed, they are used in a generic and descriptive sense only and not for purposes of limitation, the scope of the invention being set forth in the following claims.

What is claimed is:

1. A vertical silicon carbide MOSFET comprising:
   a hybrid p-type silicon carbide well region on a silicon carbide substrate;
   an n-type silicon carbide source region in the hybrid p-type silicon carbide well region;
   an n-type silicon carbide channel region adjacent and spaced apart from the n-type silicon carbide source region, wherein a channel region of the MOSFET has both n-type and p-type portions;
   a gate dielectric on the n-type silicon carbide channel region and at least a portion of the n-type silicon carbide source region;
   a gate contact on the gate dielectric;
   a first contact adjacent a portion of the hybrid p-type silicon carbide well region and the n-type silicon carbide source region; and
   a second contact on the substrate,
   wherein the hybrid p-type silicon carbide well region comprises:
   an implanted p-type silicon carbide well portion in a p-type silicon carbide epitaxial layer; and
   an implanted p-type silicon carbide contact portion that contacts the implanted p-type silicon carbide well portion and extends into the p-type epitaxial layer.

2. The vertical silicon carbide MOSFET of claim 1, wherein the hybrid p-type silicon carbide well region further comprises:
   an epitaxial p-type silicon carbide portion of the p-type silicon carbide epitaxial layer, at least a portion of which corresponds to the p-type portion of the channel region of the MOSFET.

3. The vertical silicon carbide MOSFET of claim 1, further comprising an n-type epitaxial layer between the hybrid p-type silicon carbide well region and the substrate.

4. The vertical silicon carbide MOSFET of claim 2, wherein the n-type source region and the n-type channel region comprise regions of the p-type epitaxial layer with implanted n-type dopants.

5. The vertical silicon carbide MOSFET of claim 1, further comprising a voltage absorbing region around the silicon carbide device MOSFET.

6. The vertical silicon carbide MOSFET of claim 2 further comprising a passivating layer on exposed portions of the p-type epitaxial layer.

7. A unit cell of a vertical silicon carbide power device, comprising:
   a first p-type silicon carbide epitaxial layer on an n-type silicon carbide drift region on an n-type silicon carbide substrate;
   at least one first region of n-type silicon carbide which extends through the first p-type silicon carbide epitaxial layer to the n-type drift region;
   at least one second region of n-type silicon carbide which is adjacent and spaced apart from the first region of n-type silicon carbide;
   at least one implanted buried region of p-type silicon carbide in the first p-type silicon carbide epitaxial layer, the at least one implanted buried region having a higher carrier concentration than the p-type silicon carbide epitaxial layer and being positioned between the at least one second region of n-type silicon carbide and the drift region and being substantially aligned with a side of the at least one second region of n-type silicon carbide adjacent the at least one first region of n-type silicon carbide; and
   a gate dielectric over the first region of n-type silicon carbide in the first p-type silicon carbide layer and at least a portion of the second region of n-type silicon carbide.

8. The unit cell of claim 7, further comprising:
   at least one contact region of p-type silicon carbide that extends through the at least one second region of n-type silicon carbide to the at least one buried region of p-type silicon carbide.

9. The unit cell of claim 8, further comprising:
   a gate contact on the gate dielectric;
   a first contact so as to contact a portion of the at least one contact region and the second region of n-type silicon carbide; and
   a second contact on the substrate.

10. The unit cell of claim 7, further comprising an n-type epitaxial layer between the first p-type silicon carbide epitaxial layer and the substrate.

11. The unit cell of claim 7, wherein the first and second regions of n-type silicon carbide are regions of the first p-type epitaxial layer with implanted n-type dopants.

12. The unit cell of claim 7 further comprising a passivating layer on exposed portions of the first p-type epitaxial layer.

13. The unit cell of claim 7, further comprising a voltage absorbing region around the silicon carbide device.

14. A silicon carbide Metal-Oxide Semiconductor (MOS) gated device, comprising:
   a hybrid silicon carbide well region of a first conductivity type, comprising:
   a first silicon carbide epitaxial layer of the first conductivity type;
   an implanted well portion of the first conductivity type in the silicon carbide epitaxial layer; and
   an implanted contact portion that contacts the implanted well portion and extends to a surface of the epitaxial layer;
   a first silicon carbide region of a second conductivity type at least in part within the hybrid silicon carbide well region;
   a second silicon carbide region of the second conductivity type adjacent the well region and spaced apart from the first silicon carbide region;
   a gate dielectric on the second silicon carbide region and at least a portion of the first silicon carbide region;
   a gate contact on the gate dielectric; and
   wherein an unimplanted portion of the epitaxial layer corresponds to a channel region of the device.

15. The device of claim 14, wherein the first conductivity type is p-type and the second conductivity type is n-type.

16. The device of claim 14, wherein the first conductivity type is n-type and the second conductivity type is p-type.

17. The device of claim 14, wherein the epitaxial layer comprises an epitaxial layer on a drift region of the second conductivity type, wherein the first region of silicon carbide extends to the drift region and wherein the device comprises a field effect transistor.

18. The device of claim 17, wherein the drift region comprises an epitaxial layer of silicon carbide.

19. The device of claim 17, wherein the drift region comprises a silicon carbide substrate.

20. The device of claim 14, wherein the epitaxial layer comprises an epitaxial layer on a layer of first conductivity type silicon carbide, wherein the first region of silicon carbide extends to the layer of first conductivity type silicon carbide and wherein the device comprises an insulated gate bipolar transistor.

21. The device of claim 20, wherein the layer of first conductivity silicon carbide comprises an epitaxial layer of silicon carbide.

22. The device of claim 20, wherein the layer of first conductivity type silicon carbide comprises a silicon carbide substrate.

23. The vertical silicon carbide MOSFET of claim 2, wherein the implanted p-type silicon carbide contact portion has a carrier concentration greater than a carrier concentration of the implanted p-type silicon carbide well portion.

24. The vertical silicon carbide MOSFET of claim 23, wherein the implanted p-type silicon carbide well portion has a carrier concentration of from about $1.0 \times 10^{17}$ cm$^{-3}$ to about $1 \times 10^{18}$ cm$^{-3}$ and wherein the implanted p-type silicon carbide contact portion has a carrier concentration of about $1.0 \times 10^{19}$ cm$^{-3}$.

25. A vertical silicon carbide MOSFET comprising:
a hybrid p-type silicon carbide well region on a silicon carbide substrate, wherein the hybrid p-type silicon carbide well region comprises:
an implanted p-type silicon carbide well portion in a p-type silicon carbide epitaxial layer; and
an implanted p-type silicon carbide contact portion that contacts the implanted p-type silicon carbide well portion and extends into the p-type epitaxial layer, the implanted p-type silicon carbide contact portion having a carrier concentration greater than a carrier concentration of the implanted p-type silicon carbide well portion;
an n-type silicon carbide source region in the hybrid p-type silicon carbide well region;
an implanted n-type silicon carbide channel region adjacent and spaced apart from the n-type silicon carbide source region;
a gate dielectric on the implanted n-type silicon carbide channel region;
a gate contact on the gate dielectric;
a first contact adjacent a portion of the hybrid p-type silicon carbide well region and the n-type silicon carbide source region; and
a second contact on the substrate.

26. A silicon carbide Metal-Oxide Semiconductor (MOS) gated device, comprising:
a hybrid silicon carbide well region of a first conductivity type, including:
a first silicon carbide epitaxial layer of the first conductivity type;
an implanted well portion of the first conductivity type in the silicon carbide epitaxial layer; and
an implanted contact portion having the first conductivity type that contacts the implanted well portion,
wherein an unimplanted portion of the epitaxial layer corresponds to a channel region of the device.

27. The silicon carbide MOS gated device of claim 26, wherein the implanted contact portion has a carrier concentration greater than a carrier concentration of the implanted well portion.

* * * * *